United States Patent
de Kock et al.

[11] Patent Number: 5,804,972
[45] Date of Patent: Sep. 8, 1998

[54] PARTIAL-DISCHARGE MEASURING DEVICE

[75] Inventors: Nicholas de Kock, Winterthur; Ingo Herbst, Greifensee, both of Switzerland

[73] Assignee: Asea Brown Boveri AG, Baden, Switzerland

[21] Appl. No.: 587,531

[22] Filed: Jan. 17, 1996

[30] Foreign Application Priority Data

Mar. 1, 1995 [DE] Germany .................. 198 07 032.1

[51] Int. Cl.⁶ .......................... G01R 31/12; G01N 27/60
[52] U.S. Cl. ............................. 324/536; 324/455
[58] Field of Search ................... 324/536, 455, 324/456, 501, 629, 632, 687, 688, 72, 122

[56] References Cited

U.S. PATENT DOCUMENTS

| | | | |
|---|---|---|---|
| 3,496,496 | 2/1970 | Fiebel | 333/260 |
| 3,869,665 | 3/1975 | Kenmochi | 324/536 |
| 4,277,746 | 7/1981 | Abe et al. | 324/72 |
| 4,882,682 | 11/1989 | Takasuka | 324/536 |
| 5,028,863 | 7/1991 | Negle | 324/72 |
| 5,146,170 | 9/1992 | Ishikawa | 324/536 |
| 5,256,976 | 10/1993 | Ishikawa | 324/536 |

FOREIGN PATENT DOCUMENTS 0134187  7/1984  European Pat. Off. .

Primary Examiner—Glenn W. Brown
Attorney, Agent, or Firm—Burns, Doane, Swecker & Mathis, L.L.P.

[57] ABSTRACT

A partial-discharge measuring device (3) which detects partial discharges in a gas-insulated, metal-enclosed, high-voltage system. The device includes an annular-gap antenna (6) arranged on the inner surface of the metal enclosure (1), a coaxial measuring cable (7) guided to a measuring instrument, and a tapering adaptor conductor (8) which connects the annular-gap antenna (6) and the coaxial measuring cable (7). The annular gap (9) of the antenna is determined by a plate-shaped electrode (10) which is inserted in an electrically insulated fashion into an opening (5), provided for a flanged attachment (4) in the metal enclosure (1). The adaptor conductor (8) includes an inner conductor, which supports the electrode (10), and is guided onto the shielded conductor (14) of the measuring cable (7), and an outer conductor which is guided onto the shield (15) of the measuring cable (7). The flanged attachment (4) tapers in the shape of a funnel between the opening (5) and the flange (16), and forms with its inner surface a first portion of the outer conductor. The partial-discharge measuring device (3) is of a simple and compact design and can be produced economically. In the UHF region, which is important for an accurate measurement of partial discharges, its transfer function exhibits at frequencies between 300 MHz and 1.8 GHz a portion which is high and flat. The measuring accuracy and sensitivity of the partial-discharge measuring device (3) are therefore particularly high in this frequency region.

13 Claims, 4 Drawing Sheets

PARTIAL-DISCHARGE MEASURING DEVICE

FIELD OF THE INVENTION

The present invention relates to a device for measuring partial discharges in a gas-insulated metal-enclosed high-voltage system. The device detects electromagnetic waves emitted by partial-discharge pulses in the gas-insulated system. As a result, dielectric problems of the system can be detected and located at an early stage. The electromagnetic waves generated by the partial-discharge pulses reach from the HF region through the VHF region into the UHF region and can have frequencies of up to approximately 2000 MHz.

BACKGROUND OF THE INVENTION

Partial-discharge measurements in the HF region and VHF region have long been customary. However, such measurements are greatly impaired-by corona discharges in air which are produced outside the system and emit electromagnetic waves of up to 300 MHz with high intensity. To prevent such impairment, it is desirable to carry out the measurements in the UHF region.

Because of the prescribed dielectric dimensions of the gas-insulated system, it is not possible to arrange a sensor required for partial-discharge measurements in the gas space between the current conductor (which is under high tension) of the system and the metal enclosure. Accordingly, plate-shape electrodes have generally become established as measuring sensors, and are typically arranged in an opening in the metal enclosure. Such an electrode is part of an annular-gap antenna which detects electromagnetic waves emanating from a partial discharge, and feeds them to a measuring instrument via an adaptor conductor and a coaxial measuring cable.

A known partial-discharge measuring device is specified in EP 0 134 187 B1. The device includes a plate-shaped electrode, which is inserted in an electrically insulated fashion into an opening in the metal enclosure of a gas-insulated, metal-enclosed, high-voltage system. The device also includes a connecting part having coaxially guided coupling elements including an outer element in the shape of a outer (hollow) cone and an inner one is designed in the shape of a cone. The hollow conical coupling element is guided from the edge of the opening in the metal enclosure onto the shield, and the inner conical coupling element is guided from the electrode onto the shielded conductor of the measuring cable. The diameter of the coupling elements can be selected such that in the case of a partial discharge, electromagnetic waves received by the electrode acting as an annular-gap antenna are fed via the coupling conductor into the coaxial measuring cable virtually without reflections, resulting in a relatively high degree of measuring accuracy.

However, this device is complicated and requires a relatively large amount of space, since the hollow conical coupling element must be matched to the opening in the metal enclosure and be galvanically coupled thereto. In this arrangement, electrical and mechanical coupling elements are required in the region of the opening.

SUMMARY OF THE INVENTION

Accordingly, one object of this invention is to provide a novel partial-discharge measuring device which is simple and compact, can be produced in a cost-effective way, and provides a high degree of measuring accuracy in the UHF region.

The partial-discharge measuring device according to the present invention includes a sensor which has a flat profile, can easily be installed in a flanged attachment of the metal enclosure of a gas-insulated, metal-enclosed, high-voltage system, and includes an annular-gap antenna. This sensor is highly sensitive in both the HF and the VHF region. The sensor is simple in design and can use an already existing part of the metal enclosure to form the annular gap and to provide an output to the measuring cable which is free from reflections. Since the sensor is generally supported by a flanged cover of the metal enclosure, additional mechanical and electrical coupling elements are eliminated in the region of the opening. At the same time, the sensor can be installed in gas-insulated, metal-enclosed systems whose metal enclosures exhibit suitably designed flanged attachments.

It is further advantageous that in the partial-discharge measuring device according to the invention a plate-shaped electrode which codetermines the annular gap of the antenna is shielded by the contours of the flanged attachment. Additional shielding means are thereby made superfluous. Since the annular-gap antenna exhibits small geometrical dimensions, the partial-discharge measuring device according to the invention, which is installed in a gas-insulated, metal-enclosed, high-voltage system, can include a large number of sensors and thus render possible a particularly careful and accurate monitoring of the system for partial discharges.

BRIEF DESCRIPTION OF THE DRAWINGS

A more complete appreciation of the invention and many of the attendant advantages thereof will be readily obtained by reference to the following detailed description when considered in connection with the accompanying drawings, wherein.

DESCRIPTION OF THE PREFERRED EMBODIMENT

Figure 1:
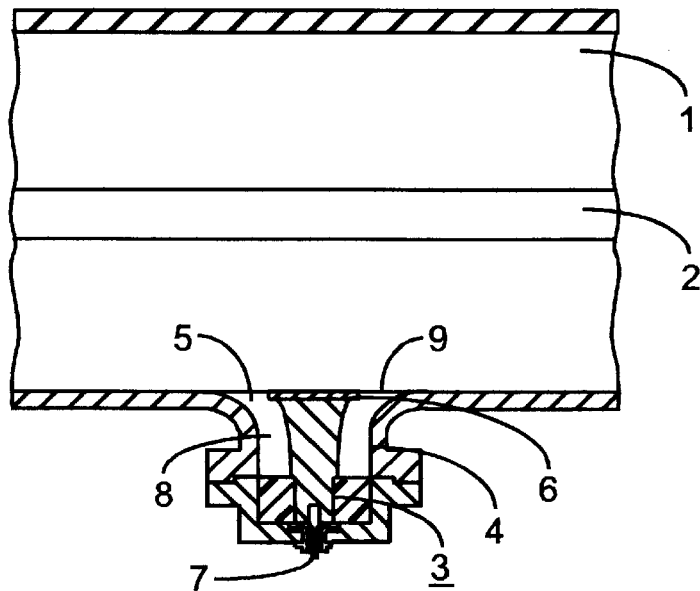
FIG. 1 shows a view of an axially guided section through a portion, designed essentially in a cylindrically symmetrical fashion, of the metal enclosure of a gas-insuated, metal-enclosed, high-voltage system having a partial-discharge device according to the invention.
Figure 2:
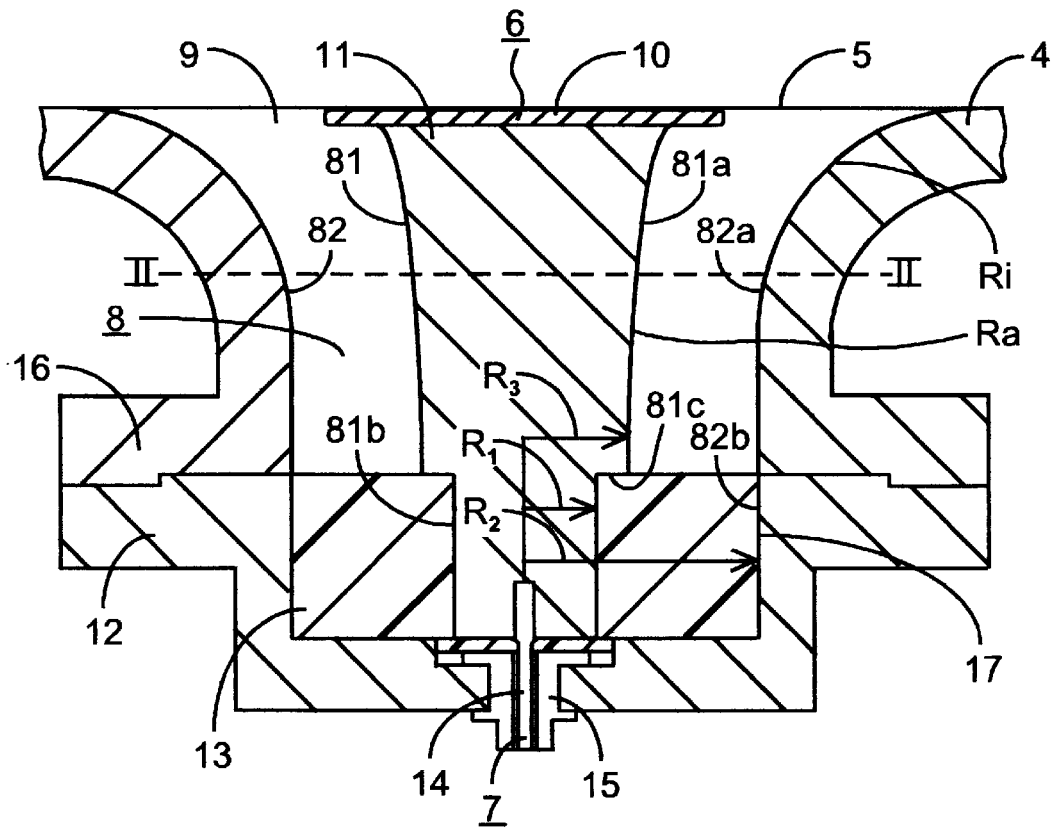
FIG. 2 shows a view of a section through a first embodiment of a sensor included in the partial-discharge measuring device of FIG. 1.

FIGS. 1 and 2 show a tubular portion, of the enclosure 1 of a metal-enclosed, high-voltage system which is filled with an insulating gas, such as $SF_6$, for example, at a typical pressure of a few bars. A current conductor 2 under high tension is arranged on the tube access in an electrically insulating way. A device 3 is provided for measuring partial discharges in the metal enclosure 1. The partial-discharge measuring device 3 is inserted into an opening 5 provided by a flanged attachment 4 in the metal enclosure 1. The device 3 includes a sensor having an annular-gap antenna 6, a coaxial measuring cable 7 leading to a measuring instrument (not shown) and a tapering adaptor conductor 8 formed between. The conductor 8 connects an annular gap 9, defined as the area between the annular-gap antenna 6 and the edge of opening 5 and the measuring cable 7. As shown, the opening 5 is defined by the inner surface of the flanged attachment 4, and the annular gap 9 is defined between the flanged attachment 4 and the antenna 6.

It may be seen from FIG. 2 that the annular gap antenna 6 includes a disk 10 and supporting member 11. The annular gap 9 is determined by an electrically conductive disk 10 which is made from a material, and which is mounted on the widened end of a thickening, rotationally symmetrical supporting body 11 made from a material that is a good electrical conductor. The supporting body 11 is held in an electrically insulated fashion on a metal cover 12, which can be mounted in a gas-tight fashion to the flange 16 of the flanged attachment 4, of the metal enclosure 1. A depression in the flanged cover 12 is provided to receive an insulator 13 which supports the supporting body 11.

The adaptor conductor 8 includes in a coaxial of an inner conductor 81 and an outer conductor 82. The inner conductor is formed by the outer surface of the supporting body 11, and connects the disk 10 to the shielded conductor 14 of the measuring cable 7. The outer conductor is connected to the shield 15 of the measuring cable 7. In a first portion 82a, the outer conductor of the adaptor conductor 8 is predominantly formed by the inner surface of the funnel-shaped flanged attachment 4 and tapers in the shape of a funnel between the edge of the opening 5 and a flange 16, which holds the flanged cover 12.

The first portion 82a of the outer conductor and a first portion 81a of the inner conductor formed by the outer surface of the supporting body 11 are curved approximately in the shape of a circular arc (i.e., have diameters which vary nonlinearly). The radii $R_a$ and $R_i$ of curvature are selected such that, in a first impedance matched portion formed by these two portions, the characteristic impedance is matched to the characteristic impedance the coaxial cable 7 (for example, 50Ω).

The insulator 13 has the shape of a hollow cylinder. A lateral surface bears against the border 17, forming a second portion of the outer conductor of the depression of the flanged cover 12. The inner surface bears against the outer surface of insulator 13 of a second portion 81b of the inner conductor formed by the supporting body 11. The radius $R_2$ of the second portion 82b of the outer conductor, and the radius $R_1$ of the second portion 81b of the inner conductor are selected such that in a second impedance-matched portion (determined by the second portion of the outer conductor, by the second portion of the inner conductor and by the insulator 13), the characteristic impedance of the adaptor conductor 8 is matched to the characteristic impedance of the coaxial cable 7.

In addition, there is further provided between the first portion (81a, 82a) and the second portion (81b, 82b) of the adaptor conductor 8 a third conductor portion 81c which is bounded by a lateral surface, of cylindrical design, of the supporting body 11 (having a diameter $2R_3$ ($2R_3$ designating the substantially constant diameter of the cylinder third conductor portion) and by an inner surface, of cylindrical design, of the flanged attachment 4 having the diameter $2R_2$), and exhibits a characteristic impedance matched to the measuring cable 7. Upon transition from the third or first portion to the second portion, determined by the insulator 13, of the adaptor conductor 8, the diameter $2R_3$ of the supporting body 11 forming the inner conductor tapers in a stepped fashion to the diameter $2R_1$.

The method of operation of this partial-discharge measuring device is as follows:

In the event of the formation of partial discharges, electromagnetic waves are produced in the metal enclosure. Depending on the magnitude of the high voltage (up to 1000 kV), these waves exhibit more or less strongly formed frequency bands in the UHF region. These frequency bands, which are for example, at 0.5 or at 1.5 GHz, are detected by the partial-discharge measuring device 3 with good accuracy and with high sensitivity. It is particularly advantageous that interfering frequency bands up to 300 MHz can be filtered out. Such frequency bands can be fed into the metal enclosure 1 due to unavoidable corona discharges on outdoor components. The electromagnetic waves assigned to the frequency bands are launched into the annular gap 9 of the annular-gap antenna 6 and guided to the measuring cable 7 via the adaptor conductor 8.

With a disk diameter of between 50 and 100 mm and a disk thickness of, for example, 2 millimeters, the annular gap 9 has a width in the range of millimeters to centimeters, for example 10 mm. A particularly intense launching of the electromagnetic waves into the annular gap 9 is achieved when the disk 10 is not led up particularly tight against the current conductor 2. However, it is generally advantageous for dielectric reasons to recess the disk 10 slightly into the opening 5 at the cost of measurement sensitivity.

The launched waves are guided practically free from losses along the surfaces of the flanged attachment and the supporting body 11 from the annular gap 9 through the insulator 13 into the measuring cable 7. At the site of transition from air into the insulator 13, a reflection of the launched waves is largely avoided because the radius $R_1$ of the supporting body tapers in a stepped fashion.

Figure 3:
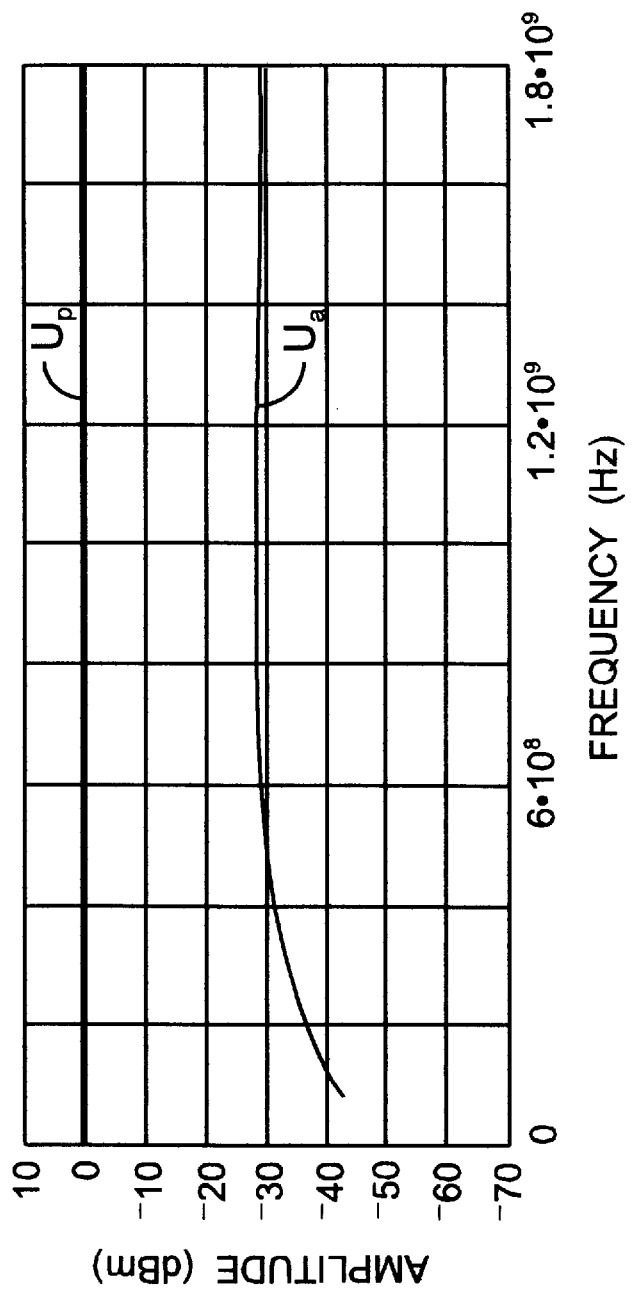
FIG. 3 shows a diagram in which the amplitudes of a test voltage U p applied to the current conductor of the high-voltage system, and of a voltage $U_a$ present as a response to the test voltage at the output of the sensor of FIG. 2 are represented as a function of frequency.

FIG. 3 shows a plot of the amplitude of a signal $U_P$, present at the current conductor 2, as a function of frequency and the amplitude of a signal $U_a$ present as a response to this signal at the output of the sensor of the partial-discharge measuring device according to the invention. The frequency response of the signal $U_a$ reproduces the transfer function of the partial-discharge measuring device according to the invention. The transfer function has a high and flat portion in the UHF region, important for accurate partial-discharge measurement, for frequencies between 300 MHz and 1.8 GHz. Partial-discharge measurements can therefore be carried out with the aid of the partial-discharge measuring device according to the invention in the UHF region with high accuracy and high sensitivity.

Figure 4:
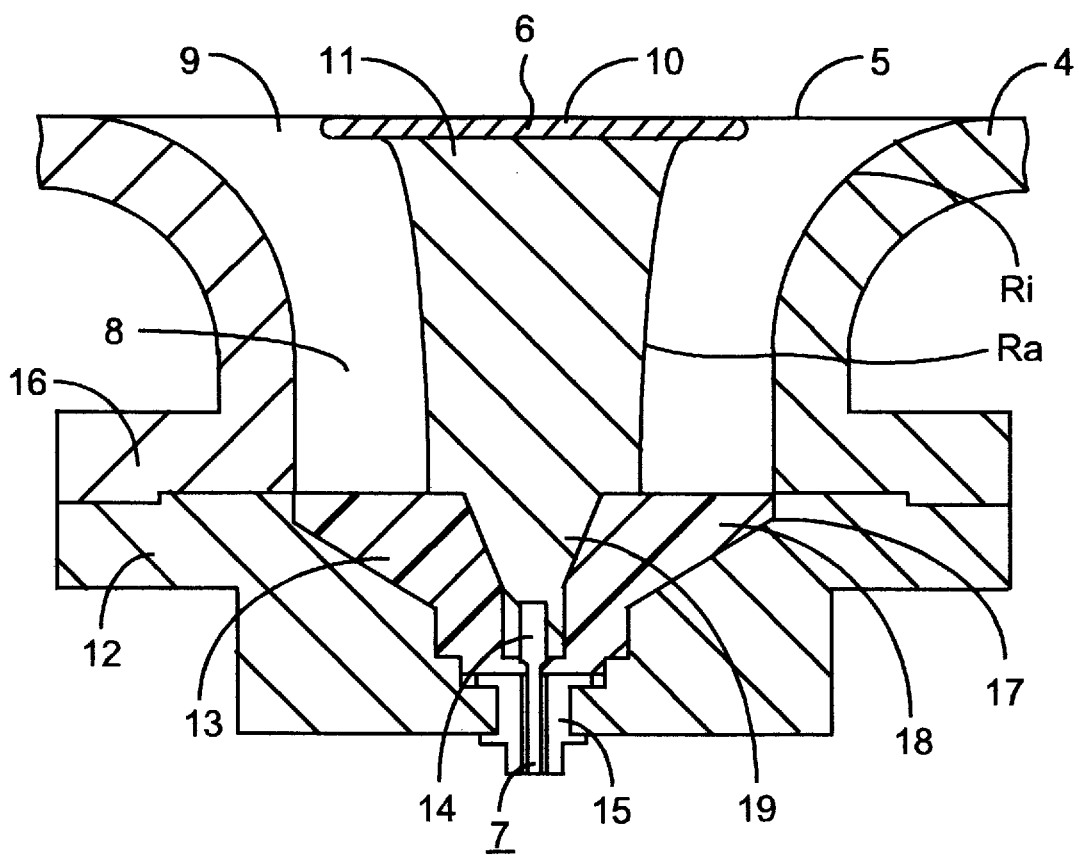
FIG. 4 shows a view of a section through a second embodiment of a sensor included in the partial-discharge measuring device in accordance with FIG. 1.

FIG. 4 shows a second embodiment of the partial-discharge measuring device 3 according to the invention. The same reference symbols denote parts having the same effect as in the embodiment of FIG. 2. In contrast with the previously described sensor, the insulator 13 has at least partially the form of a hollow conical frustum having a conical outer surface 18 inclined in the direction of the measuring cable 7 and a conical inner surface 19 which is more steeply inclined in the same direction. The conical outer surface 18 bears against the border 17 forming the second portion of the outer conductor, and the conical inner surface 19 bears against an outer surface, forming the second portion of the inner conductor, of the supporting body 11. The inclinations of the outer conductor surfaces and inner conductor surfaces bearing against the conical insulator surfaces 18 and 19 are selected such that the characteristic impedance of the adaptor conductor 8 is matched to the characteristic impedance of the coaxial cable in a second portion determined by the second portion of the outer conductor, by the second portion of the inner conductor and by the insulator 13. Reflection losses upon transition of the launched waves from the insulator 13 into the measuring cable 7 are minimized by the conical design of the insulator 13 and the adaptor conductor 8.

Figure 2A:
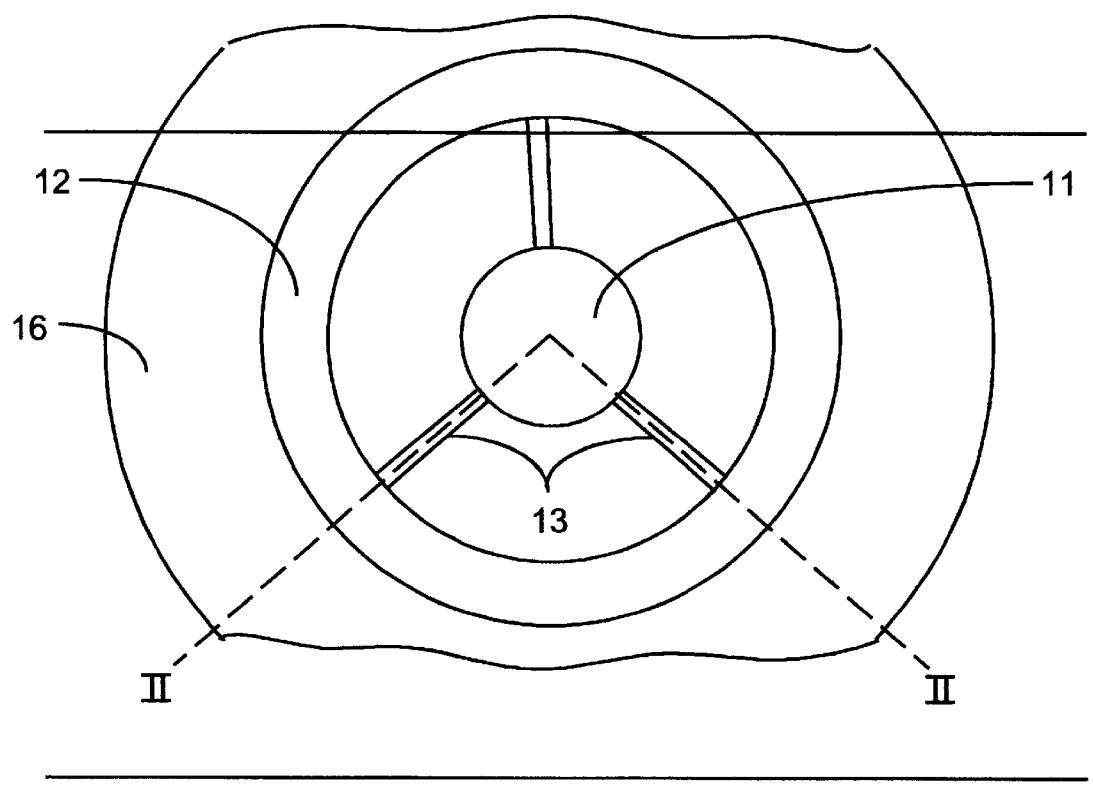
FIG. 2a shows a cross-sectional view of the device of FIG. 2.

If the insulator 13 includes retaining strips or retaining stubs (as shown in FIG. 2a) arranged in the fashion of spokes between the supporting body 11 and the border 17 of the flanged cover 12, the sensor exhibits particularly low losses. Furthermore, it is also possible to fix the supporting body 11 on an insulator 13 held between its outer surface and the inner surface of the flanged attachment 4.

The first portion, adjoining the edge of the opening 5 and formed by the inner surface of the flanged attachment 4, of the outer conductor and the first portion, adjoining the disk 10 and formed by the outer surface of the supporting body 11, of the inner conductor can also be inclined in the shape of a cone. To maximize transmission efficiency, the inclination of the first portion of the outer conductor and that of the first portion of the inner conductor are preferably selected such that the characteristic impedance of the adaptor conductor is matched to the characteristic impedance of the coaxial cable in a first portion formed by these two portions.

Obviously, numerous modifications and variations of the present invention are possible in the light of the above teachings. It is therefore to be understood that within the scope of the appended claims, the invention may be practiced otherwise than as specifically described herein.

What is claimed as new and desired to be secured by Letters Patent of the United States is:

1. A device for detecting partial discharges in a gas-insulated, high-voltage system, comprising:

a plate-shaped electrode inserted in an electrically insulated manner into a funnel-shaped opening of a metal enclosure, the opening defined by a flanged attachment of the metal enclosure;

a flange arranged outside the metal enclosure, the flange being supported by the flanged attachment;

an annular gap antenna arranged within an inner surface of the funnel-shaped opening;

a coaxial measuring cable connected to a measuring device, the cable having a shield surrounding a shielded conductor; and a tapering adaptor conductor having a coaxially-arranged inner conductor and outer conductor, wherein the inner conductor is formed by a supporting body which supports the plate-shaped electrode and is connected to the shielded conductor, and the outer conductor is connected to the shield and includes a first portion formed by the inner surface of the flanged attachment;

wherein the first portion of the outer conductor and a first portion of the inner conductor, formed by an outer surface of the supporting body, are curved such that the first portions have diameters which vary non-linearly.

2. The device of claim 1, wherein a curvature radius of the first portion of the outer conductor and a curvature radius of the first portion of the inner conductor are selected such that the characteristic impedance of the adaptor conductor is matched to the characteristic impedance of the coaxial cable in a first impedance-matched portion.

3. The device of claim 1, wherein the first portion of the outer conductor and the first portion of the inner conductor are inclined.

4. The device of claim 3, wherein the inclinations of the first portions are selected to match the characteristic impedance of the adaptor conductor and the coaxial cable.

5. The device of claim 1, wherein an insulator is provided between the supporting body and the outer conductor.

6. The device of claim 1, wherein the supporting body is held in an electrically insulated manner on a cover mounted on the flange.

7. The device of claim 6, wherein the insulator is provided with a spoked arrangement of retaining strips or stubs.

8. The device of claim 6, wherein the cover has a depression forming a second portion of the outer conductor, the depression receiving an insulator which supports the supporting body.

9. The device of claim 8, wherein at least part of the insulator is generally in the shape of a hollow conical frustum having an inner radius which varies linearly at a first rate, and an outer radius which varies linearly at a second rate.

10. The device of claim 9, wherein the inclination of the second portion of the outer conductor and the second portion of the inner conductor are selected to match the characteristic impedances of the adaptor conductor and the coaxial cable.

11. The device of claim 8, wherein the insulator has a lateral surface bearing against the border and an inner surface bearing against the outer surface of a second portion of the inner conductor formed by the supporting body.

12. The device of claim 11, wherein a radius of the second portion of the outer conductor and a radius of the second portion of the inner conductor are selected to match the characteristic impedances of a second portion of the adaptor conductor and the coaxial cable.

13. The device of claim 11, wherein the diameter of the supporting body is reduced in the second portion of the adaptor conductor.

* * * * *